(12) United States Patent
Nevin et al.

(10) Patent No.: US 7,122,416 B2
(45) Date of Patent: Oct. 17, 2006

(54) METHOD FOR FORMING A FILLED TRENCH IN A SEMICONDUCTOR LAYER OF A SEMICONDUCTOR SUBSTRATE, AND A SEMICONDUCTOR SUBSTRATE WITH A SEMICONDUCTOR LAYER HAVING A FILLED TRENCH THEREIN

(75) Inventors: William Andrew Nevin, Portadown (GB); Colin Stephen Gormley, Belfast (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/699,503

(22) Filed: Oct. 31, 2003

(65) Prior Publication Data

US 2005/0095806 A1 May 5, 2005

(51) Int. Cl.
*H01L 21/8238* (2006.01)
*H01L 29/00* (2006.01)

(52) U.S. Cl. .................. 438/221; 438/296; 438/424; 257/510

(58) Field of Classification Search ............. 438/221, 438/296, 424, 426; 257/506, 510
See application file for complete search history.

(56) References Cited

U.S. PATENT DOCUMENTS

| | | | |
|---|---|---|---|
| 4,639,288 A | 1/1987 | Price et al. | |
| 4,656,730 A | 4/1987 | Lynch et al. | |
| 4,839,306 A | 6/1989 | Wakamatsu | |
| 6,081,662 A * | 6/2000 | Murakami et al. | 703/14 |
| 6,180,493 B1 * | 1/2001 | Chu | 438/437 |
| 6,198,150 B1 | 3/2001 | Gelzinis | |
| 6,468,853 B1 * | 10/2002 | Balasubramanian et al. | 438/221 |
| 6,544,861 B1 * | 4/2003 | Joo | 438/424 |
| 6,627,514 B1 | 9/2003 | Park et al. | |
| 6,812,115 B1 * | 11/2004 | Wieczorek et al. | 438/424 |
| 2001/0023134 A1 | 9/2001 | Akatsu et al. | |
| 2001/0045614 A1 | 11/2001 | Begley et al. | |
| 2002/0121673 A1 | 9/2002 | Jono et al. | |
| 2004/0102005 A1 * | 5/2004 | Dong et al. | 438/257 |
| 2004/0198038 A1 * | 10/2004 | Huang et al. | 438/637 |

FOREIGN PATENT DOCUMENTS

EP 0 048 175 9/1981

\* cited by examiner

*Primary Examiner*—Hsien-Ming Lee
(74) *Attorney, Agent, or Firm*—Gauthier & Connors LLP

(57) ABSTRACT

A method for forming an isolation filled trench (25) in a silicon layer (21) of an SOI structure (20). The trench (25) is relieved adjacent its open mouth (30) in order to displace the commencement of bridging of the trench (25) with the filling material, to a level (36) well below a first surface (27) of the silicon layer (21) for in turn displacing voids (35) from the open mouth (30) into the trench (25) below the level (36). The trench may be relieved by forming tapered portions (40) in the side wells (29) adjacent the open mouth (30), and/or by relieving one or more lining layers (32) in the trench (25) adjacent the open mouth (30) to form tapered portion (52) and (53). Instead of relieving the trench (25) by tapering the side walls (29) relieving recesses may be formed into the first surface (27) of the silicon layer (21) adjacent the open mouth (30). By relieving the trench (25) or one or more of the lining layers (32) adjacent the open mouth (30) the commencement of bridging of the trench with the filling material is displaced downwardly to a level (36), which displaces voids formed in the trench below the level (36). By sufficiently relieving the trench (25) and/or lining layers (32) adjacent the open mouth to a sufficient depth the formation of voids in the trench may be completely avoided.

39 Claims, 8 Drawing Sheets

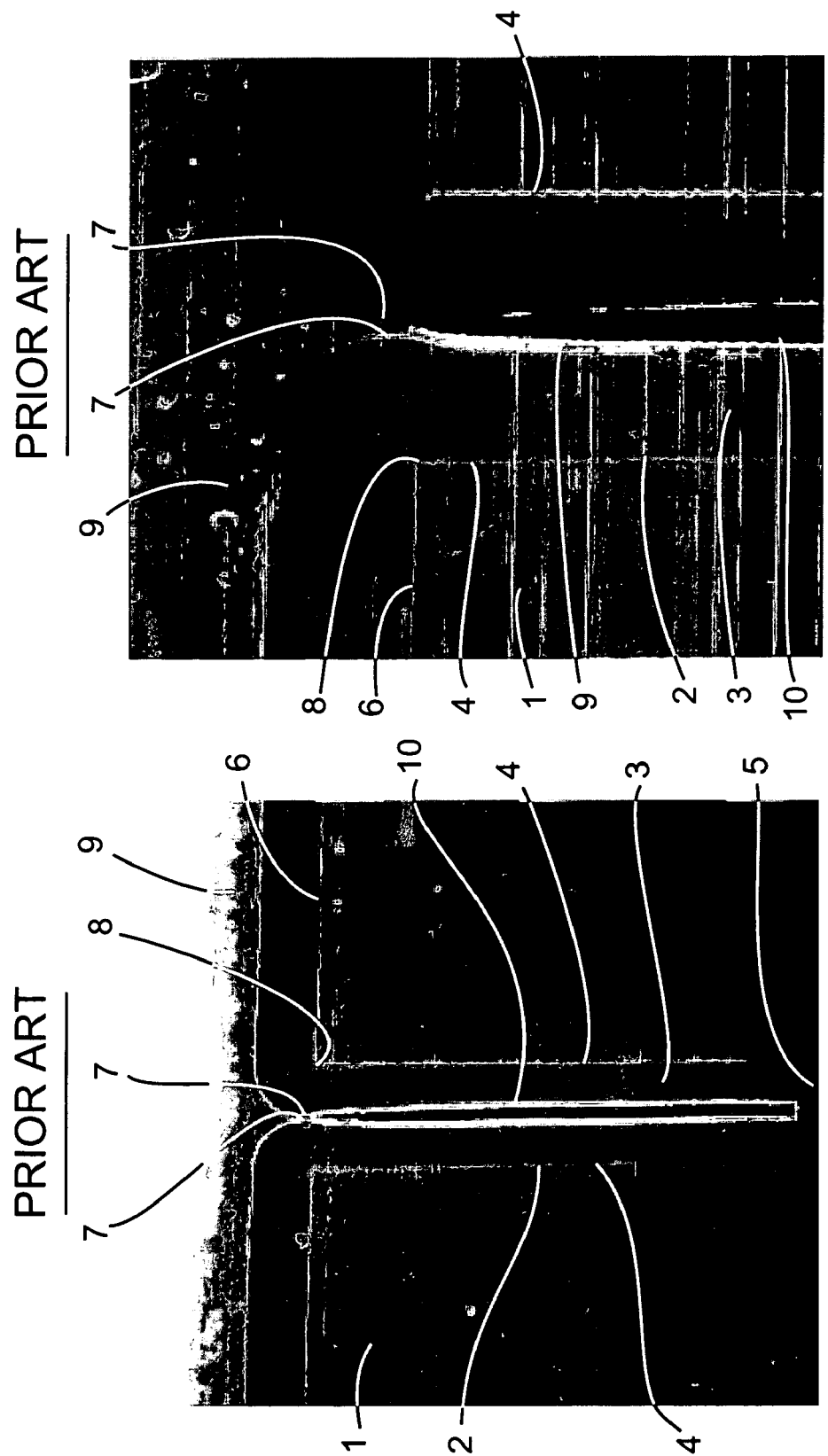

METHOD FOR FORMING A FILLED TRENCH IN A SEMICONDUCTOR LAYER OF A SEMICONDUCTOR SUBSTRATE, AND A SEMICONDUCTOR SUBSTRATE WITH A SEMICONDUCTOR LAYER HAVING A FILLED TRENCH THEREIN

FIELD OF THE INVENTION

The present invention relates to a method for forming a filled trench in a semiconductor layer of a semiconductor substrate, and in particular, to such a method for forming a filled trench with the effect of trench voids minimised. The invention also relates to a semiconductor substrate with a semiconductor layer having a filled trench formed therein with the effect of trench voids minimised.

BACKGROUND TO THE INVENTION

A trench isolated silicon layer in a semiconductor substrate is commonly required. For example, where it is desired to electrically insulate discrete areas of a silicon layer one from the other trenches filled with electrically insulating filling material are formed in the silicon layer for electrically insulating the respective discrete areas. Commonly, such layers requiring trench filled isolation may be a silicon layer of a silicon on insulator (SOI) structure. A buried insulating layer, typically, an oxide layer is located under the silicon layer, and the silicon layer and oxide layer are in turn supported on a handle layer. Where trench filled electrical isolation is required, the trench or trenches are formed through the silicon layer to the buried insulating layer. After forming of the trenches, the trenches are filled with an appropriate electrical insulating material, which may be an oxide or silicon nitride. The oxide or silicon nitride are generally deposited by a chemical vapour deposition process. Alternatively, in order to strengthen the SOI structure, the trenches may be initially partially filled with an electrical insulating material, such as for example, an oxide, which would form a lining layer in the trench. The remaining part of the trench would then be filled with polysilicon. Typically, the oxide is deposited in one or more layers in the trench which line the base which is formed by the buried oxide layer, and the side wells of the trench. The remaining unfilled portion of the trench is then filled with polysilicon. Typically, the polysilicon is deposited by a chemical vapour deposition process.

Whether the trenches are entirely filled with a single filling material, for example, oxide or silicon nitride, or partially filled with oxide or silicon nitride and then with polysilicon, problems arise in the filling of such trenches.

As the filling material, be it oxide silicon nitride or polysilicon, or a combination of such materials are being sequentially deposited, a layer of the filling material of progressively increasing depth forms on the base of the trench and on the side walls of the trench, as well as on the surface of the silicon layer through which the trench is formed into the silicon layer. Unfortunately, the depth of the layers of the filling material formed on the base and the side walls of the trench, and on the surface of the silicon layer do not increase in depth at a uniform rate. Typically, the depth of the filling material on the surface of the silicon layer increases at a greater rate then the depth of the filling material on the side walls of the silicon layer. This, thus, leads to an effect commonly referred to as "bread-loafing". Bread-loafing causes the depth of the layer of the filling material on the side walls of the trench adjacent the open mouth thereof to increase in a direction towards the other side wall at a greater rate than the rate at which the depth of the layer of the filling material on the remainder of the side wells below the open mouth increases. Accordingly, in due course as the filling of the trench progresses the bread-loafing of the filling material causes the layers of the filling material on the side walls adjacent the open mouth to meet and thus bridge the trench. Once the bread-loafing of the filling material has caused bridging of the trench, no further filling material can be filled into the trench, thus leading to the creation of a longitudinally extending void in the trench. Where the trench is to be entirely filled with deposited oxide the bread-loafing effect causes bridging of the trench with the oxide adjacent the open mouth of the trench. On the other hand, where the trench is to be lined with one or more layers of oxide, and then subsequently filled with polysilicon, the bread-loafing effect causes bridging of the trench with the polysilicon material.

Reference is now made to FIGS. 1 and 2 which are photomicrographs of different magnifications, which illustrate a cross-section of a silicon layer showing one trench formed in the silicon layer which demonstrate the effect of bread-loafing in the formation of a void in the trench. The silicon layer is indicated by the reference numeral 1 and the trench is indicated by the reference numeral 2. In this case the trench 2 was lined with an oxide layer 3 which was deposited on side walls 4, a base and on a surface 6 of the silicon layer 1. The bread-loafing effect of the oxide layers 3 can be seen at 7 adjacent the open mouth 8 of the trench 2. The bread-loafing effect of the oxide layers 3 at 7 has not caused the oxide layers 3 to bridge the trench 2. However, it has significantly narrowed the remainder of the open mouth 9 into the trench 2. A polysilicon layer 9 was then deposited over the oxide layer 3, and as can be seen the bread-loafing effect rapidly caused the polysilicon adjacent the open mouth 8 to bridge the trench. At that stage no further polysilicon could be deposited into the trench beyond the bridged open mouth 8, and thus, a void 10 extending longitudinally along the length of the trench was formed. As can be seen the void 10 extends from the open mouth downwardly towards the base. Furthermore, the void 10 terminates at the open mouth at a level substantially co-planar with the surface 6 of the silicon layer 1.

While, in general, the existence of such voids do not affect the electrical insulating characteristics of the filled trenches, they do lead to areas of entrapment where gases and liquids used in subsequent processing steps of the silicon layer can become entrapped, and subsequently lead to contamination of the silicon layer. Typically after the trenches have been filled the oxide and polysilicon layers are etched or ground back to the surface level of the silicon layer. As can be seen from FIGS. 1 and 2 etching or grinding the oxide and polysilicon layers 3 and 9 back to the surface 6 of the silicon layer 1 will remove the portion of the oxide and the polysilicon layers 3 and 9 which are bridging the trench, thus providing an opening to the void 10. Accordingly, if the silicon layer is cleaned by washing and rinsing, cleaning chemicals and/or rinsing water readily become entrapped in the void 10. Such cleaning chemicals, in general, would be contaminants in subsequent processing steps of the silicon layer, and on leaking out through the voids would lead to contamination in the subsequent processing steps which is unacceptable.

Another problem arises where a photoresist layer is to be formed on the surface 6 of the silicon layer through which voids have been exposed. In general, during the formation of a photoresist layer on a silicon or other layer the structure is spun in order to spread the photoresist layer over the surface on which the photoresist layer is to be formed. The spinning of the photoresist over areas where voids are exposed leads to uneven coating in the form of streaking of the photoresist over the surface of the silicon layer. This, thus, prevents accurate patterning of the photoresist layer. Additionally, the photoresist may become entrapped in the voids, thus leading to contamination in subsequent processing steps.

Indeed, in many cases after the filling of trenches in a trench isolated silicon layer, as well as the oxide and/or polysilicon or other such filling layers being etched or ground to the original surface of the silicon layer, the silicon layer is further ground to reduce the depth of the silicon layer. In such cases, even where a void formed in a trench does not extend up to the open mouth of the trench, subsequent grinding of the silicon layer, can lead to the removal of the bridging of the trench, thus exposing the void.

There is therefore a need for a method for forming a filled trench in a semiconductor layer of a semiconductor substrate in which the effect of trench voids is minimised. There is also a need for a semiconductor substrate with a semiconductor layer having filled trenches therein in which the effect of trench voids is minimised.

The present invention is directed towards providing such a method and a semiconductor substrate.

SUMMARY OF THE INVENTION

According to the invention there is provided a method for forming a filled trench in a semiconductor layer of a semiconductor substrate, with the effect of trench voids minimised, the method comprising the steps of:

forming a trench in the semiconductor layer through a first face thereof, the trench defining an open mouth, relieving the trench adjacent the open mouth thereof for preventing the commencement of bridging of the trench with a filling material at a level adjacent the first face of the semiconductor layer as the trench is being filled, and filling the relieved trench through the open mouth with the filling material.

Preferably, the trench is sufficiently relieved for preventing commencement of bridging of the trench with the filling material at a level above a plane extending parallel to and below a plane to which the first face of the semiconductor layer is to be finished. Advantageously, the trench is relieved adjacent the open mouth thereof on one side of the trench. Ideally, the trench is relieved adjacent the open mouth thereof on respective opposite sides of the trench.

In one embodiment of the invention the trench is lined with at least one lining layer formed therein with a lining material prior to filling of the trench.

In another embodiment of the invention the trench is relieved by relieving at least one of the lining layers adjacent the open mouth of the trench. Preferably, the trench is relieved by relieving at least the lining layer first formed in the trench. Alternatively, the trench is relieved by relieving at least one of the lining layers formed after the first of the lining layers to be formed.

Alternatively, the trench is relieved prior to lining of the trench with the at least one lining layer.

In one embodiment of the invention the trench is relieved to a depth from the open mouth in the range of 0.5 μm to 5 μm.

Preferably, each side of the trench which is relieved is relieved by tapering a portion of the side of the trench adjacent the open mouth, each tapered portion defining a tapering plane which converges towards the other side in a direction into the trench. Advantageously, the tapering plane defined by each tapered portion defines with a central plane bisecting the trench and extending longitudinally along the trench through the open mouth a relief angle in the range of 0.2° to 50°, and preferably, in the range of 4° to 40°. Ideally, the tapering plane defined by each tapered portion defines with the central plane a relief angle in the range of 6° to 20°.

In one embodiment of the invention each tapered portion defines at least two tapering planes defining respective different relief angles with the central plane. Advantageously, the tapering plane defined by each tapered portion which defines the greatest relief angle with the central plane is defined by the tapered portion adjacent the open mouth of the trench. Preferably, the relief angles defined between the tapering plane of each tapered portion and the central plane decreases from the open mouth into the trench.

Alternatively, each side of the trench which is relieved is relieved by forming a relieving recess into the first face of the semiconductor layer adjacent to and communicating with the trench adjacent the open mouth. Preferably, the relieving recess is concave when viewed in a direction into the trench.

Ideally, each side of the trench which is relieved in relieved along the entire length of the trench.

In one embodiment of the invention the trench is relieved by etching. Preferably, the etching of the trench is carried out by an RIE etch. Advantageously, the parameters of the RIE etch are controlled for minimising the depth of scallops formed by the RIE etch.

In another embodiment of the invention the forming of the trench and the relieving of the trench are carried out by the same etching process, and the parameters of the etching process are ramped during the etching process for relieving the trench. Preferably, the parameters of the etching process are controlled for minimising the formation of footings at the base of the trench.

In a further embodiment of the invention the first face of the semiconductor layer adjacent the trench is lined with the lining material during lining of the trench with at least one of the lining layers.

In another embodiment of the invention the filling material and the lining material above the first face of the semiconductor layer are thinned to a level just above the first face of the semiconductor layer. Alternatively, the filling material and the lining material above the first face of the semiconductor layer are removed to a level co-planar with the first face of the semiconductor layer.

In one embodiment of the invention the filling material is selected from any one or more of the following materials:
polysilicon,
silicon nitride, and
oxide.

In another embodiment of the invention the filling material is deposited by a chemical vapour deposition process.

In a further embodiment of the invention the lining material is selected from any one or more of the following materials:
oxide,
silicon nitride, and
polysilicon.

In one embodiment of the invention at least one of the lining layers is a deposited layer.

Preferably, each deposited lining layer is deposited by a TEOS deposition process. Advantageously, each deposited lining layer is deposited by a high conformality deposition process. Alternatively, at least one of the lining layers is a grown layer.

In one embodiment of the invention at least one of the lining layers is densified prior to filling of the trench with the filling material.

In a further embodiment of the invention the semiconductor layer is of silicon, and preferably, the semiconductor layer is of single crystal silicon.

In a further embodiment of the invention the semiconductor substrate is a semiconductor layer of a semiconductor on insulator structure, and the filled trench extends to the insulating layer.

In another embodiment of the invention the filled trench extends through the insulating layer.

Additionally the invention provides a semiconductor substrate comprising a semiconductor layer, and a filled trench formed in the semiconductor layer the filled trench being formed by the method according to the invention.

Additionally the invention provides a semiconductor substrate comprising:
 a semiconductor layer having a first face, and
 a filled trench extending into the semiconductor layer through the first face thereof, the trench defining an open mouth and having been relieved adjacent the open mouth prior to filling of the trench with a filling material for preventing the commencement of bridging of the trench with the filling material at a level adjacent the first face of the semiconductor layer as the trench is being filled therewith.

ADVANTAGES OF THE INVENTION

The advantages of the invention are many. By virtue of the fact that the commencement of bridging of the trench adjacent the open mouth is prevented, any void formed in the filled trench will not extend to the open mouth. The lower the level within the trench at which bridging commences, the greater will be the depth to which any void formed in the filled trench will be displaced from the open mouth. Thus, by displacing voids formed in the filled trench from the open mouth even if a void is formed in the filled trench the void will be sealed by the bridging formed by the filling material. Furthermore, even where the surface through which the trench is formed into the semiconductor layer is subsequently ground to reduce the depth of the semiconductor layer, in general, the entire depth of the filling material bridging the trench will not be removed, thus, leaving the void sealed within the filled trench. Once voids formed in a filled trench remain sealed, they do not in general, present a problem in the subsequent processing of the semiconductor structure.

Indeed, in certain cases by sufficiently relieving portions of the trench extending from the open mouth into the trench, the formation of voids can be entirely eliminated by the method according to the invention. By eliminating the formation of voids in a filled trench, or displacing any voids formed in the filled trench from the open mouth downwardly into the filled trench, there is no danger of voids being formed in the filled trench which could act as entrapment areas for chemicals and gases from one process step to which the semiconductor layer is subjected, which would become contaminants in a subsequent process step on leaking from the voids.

The invention and its advantages will be more clearly understood from the following description of some preferred embodiments thereof which are given by way of non-limiting examples.

BRIEF DESCRIPTION OF THE DRAWINGS

FIG. 1 is a photomicrograph of a semiconductor layer having an isolation filled trench formed therein using a prior art method.

FIG. 2 is a photomicrograph illustrating the semiconductor layer of the prior art of FIG. 1 at a greater level of magnification.

DETAILED DESCRIPTION OF PREFERRED EMBODIMENTS OF THE INVENTION

Figure 3:
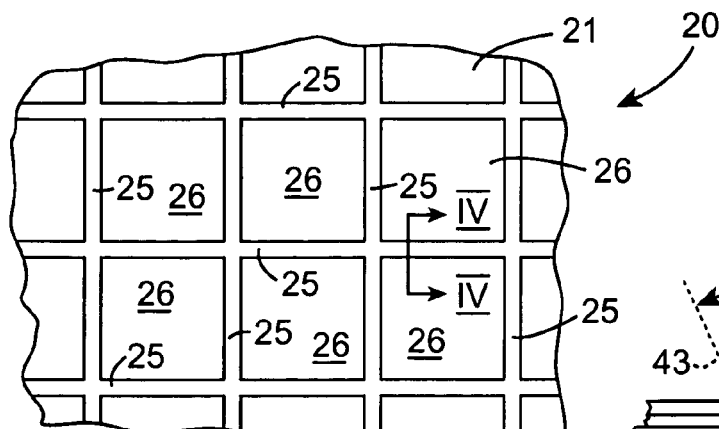
FIG. 3 is a top plan view of an SOI structure with isolation filled trenches according to the invention.
Figure 4:
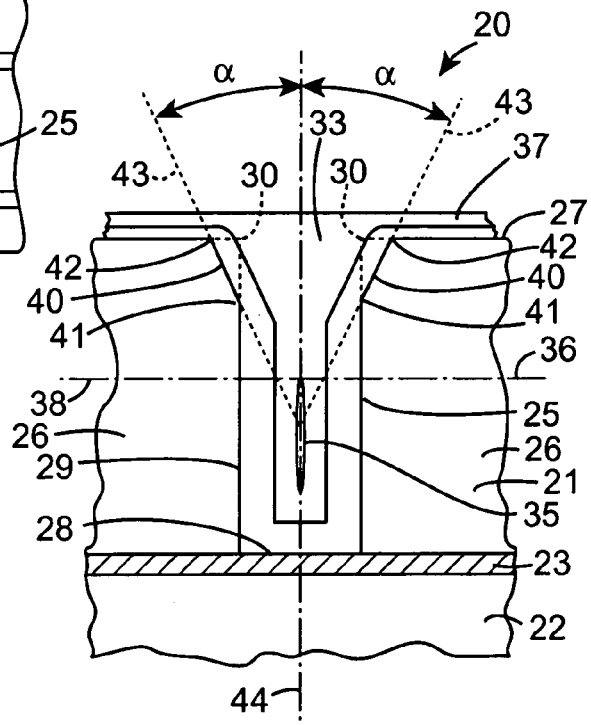
FIG. 4 is a transverse cross-sectional view of a portion of the SOI structure of FIG. 3 on the line IV—IV of FIG. 3.

Referring now to FIGS. 3 and 4 there is illustrated a portion of an SOI structure according to the invention indicated generally by the reference numeral 20 comprising a silicon layer 21 supported on handle layer 22 with a buried insulating layer 23 located between the silicon layer 21 and the handle layer 22. The silicon layer 21 and the handle layer 22 are formed from respective silicon wafers of single crystal silicon, and the buried insulating layer 23 is an oxide layer which may be thermally grown or deposited on either the handle layer 22 or the silicon layer 21 and then bonded to the other of the two layers. Alternatively, the oxide layer 23 may be thermally grown or deposited on both the silicon layer 21 and the handle layer 22, and then both oxide layers can be bonded together. The construction of such SOI structures will be well known to those skilled in the art. Filled electrical isolating trenches 25 are formed by a method according to the invention in the silicon layer 21 for electrically isolating respective discrete areas 26 of the silicon layer 21. The filled trenches 25 are arranged in a grid formation, although they may be arranged in any desired formation.

The trenches 25 are simultaneously etched, as will be described below, into the silicon layer 21 through a first face namely, a first surface 27, and are etched through the silicon layer 21 to the buried insulating layer 23. The buried insulating layer 23 forms a base 28, and the silicon layer 21 forms opposite side walls 29 of each trench 25 which extend from the base 28 to an open mouth 30 adjacent the first surface 27. The trenches 25 are simultaneously lined with a lining layer 32 of electrical insulating material, which in this embodiment of the invention is a deposited oxide layer, which may be deposited by any suitable deposition process. However, in this embodiment of the invention the oxide lining layer 32 is deposited by a tetra-ethyl-ortho-silicate (TEOS) deposition process. After deposition of the lining layer 32 the remainder of the trenches 25 are simultaneously filled with a filling material 33 which in this embodiment of the invention is polysilicon, which is deposited by a chemical vapour deposition process.

As can be seen a void 35 is formed in a lower portion of the filled trench 25, illustrated in FIG. 4. However, by virtue of the filled trenches 25 being formed by the method according to the invention the void 35 is displaced from the open mouth 30 downwardly into the trench 25 to a level 36, which defines a plane 38 extending parallel to a plane defined by the first surface 27, which is well below the first surface 27 of the silicon layer 21. Thus, when the portion of the lining layer 32 on the first surface 27 and a layer 37 of the filling material 33 on the lining layer 32 above the first surface 27 are removed to expose the first surface 27, the void 35 is well displaced from the first surface 27, so as not to form an entrapment area adjacent the first surface 27 in the silicon layer 21. Indeed as can be seen from FIG. 4 the void 35 is sufficiently displaced into the trench 25 from the open mouth 30 to permit significant further grinding, polishing and/or etching of the first surface 27 of the silicon layer 21 without opening the void 36. The layer 37 of filling material 33 and the lining layer 32 above the first surface 27 may be removed by grinding, polishing and/or etching.

The void 35 is caused by the commencement of bridging of the trench 25 by the filling material 33 as the trench 25 is being filled. Once bridging of the trench 25 commences, further filling of the trench 25 below the level at which bridging commences is prevented, thus leading to the void 35. As can be seen in this case bridging of the trench 25 commenced at the level 36 and thus, the void 35 extends downwardly into the filled trench 25 from the level 36.

In this embodiment of the invention, in order to displace the voids 35 downwardly into the trenches 25 from the open mouths 30, when forming the trenches 25, the trenches 25 are relieved adjacent their respective open mouths 30 by tapering portions 40 of the side walls 29 inwardly adjacent the open mouths 30. By forming the side walls 29 with the tapered portions 40 adjacent the open mouths 30 breadloafing, which would otherwise have occurred in the lining layer 32 adjacent the open mouths 30 is avoided. The tapered portions extend longitudinally along the length of the trenches 25. Minor bread-loafing of the lining layer 32 may occur as the tapered portions 40 transition into the side walls 29 at 41, and transition into the first surface 27 at 42. However, such bread-loafing at the transitions 42 of the tapered portions 40 has no effect on the filling material 33, which would cause the filling material 33 to bridge the trenches 25 adjacent the open mouths 30, and any breadloafing at the transitions 41 which may lead to bridging of the trenches 25 by the filling material 33 results in the bridging commencing at a relatively low level in the trenches 25, and as can be seen in this particular embodiment of the invention bridging only commences to occur at the level 36.

Each tapered portion 40 defines a tapering plane 43 which defines a relief angle $\alpha$ with a corresponding central plane 44, which is defined by the corresponding trench 25, and bisects and extends longitudinally through the corresponding trench 25. In this embodiment of the invention the relief angle $\alpha$ which each tapering plans 43 makes with the corresponding central plane 44 is approximately 6°. For ease of illustration the relief angles $\alpha$ are exaggerated in FIG. 4. Accordingly, when the lining is layer 32 is deposited on the tapered portions 40 they likewise define respective tapering planes which make substantially similar angles with the corresponding central plane 44.

Figure 5:
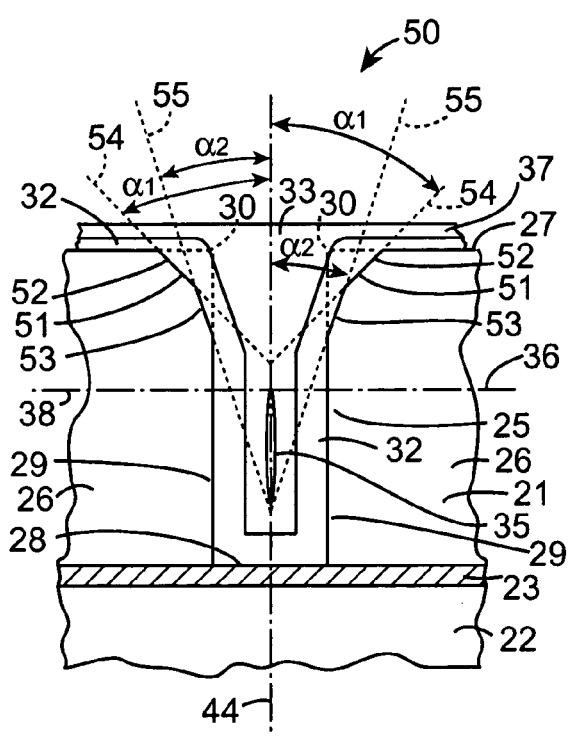
FIG. 5 is a view similar to FIG. 4 of an SOI structure according to another embodiment of the invention.

Referring now to FIG. 5 a portion of an SOI structure according to another embodiment of the invention indicated generally by the reference numeral 50 is illustrated. The SOI structure 50 is substantially similar to the SOI structure 20, and similar components are identified by the same reference numerals. The only difference between the SOI structure 50 and the SOI structure 20 is in the way the side walls 29 are relieved adjacent the open mouth 30. In this embodiment of the invention the side walls 29 are relieved by forming respective tapered portions 51. Each tapered portion 51 is formed by a first tapered portion 52 and a second tapered portion 53 which define first and second tapering planes 54 and 55, respectively. Each first tapered portion 52 is formed adjacent the corresponding open mouth 30, while the second tapered portion 53 extends from the first tapered portion 52 inwardly into the corresponding trench 25. The first tapering plane 54 defined by each first tapered portion 62 defines a first relief angle $\alpha_1$ with the corresponding central plane 44, while the second tapering plane 55 defined by each second tapered portion 53 defines a second relief angle $\alpha_2$ with the corresponding central plane 44. In this embodiment of the invention each first relief angle $\alpha_1$ formed by each first tapering plane 54 with the corresponding central plane 44 is greater than the second relief angle $\alpha_2$ formed by each second opening plane 55 with the corresponding central plane 44. In this embodiment of the invention each first relief angle $\alpha_1$ is approximately 19°, while each second relief angle $\alpha_2$ is approximately 8°. For ease of illustration the relief angles $\alpha_1$ and $\alpha_2$ are exaggerated in FIG. 5.

Once the trench 25 with the first and second tapered portions 52 and 53 have been formed, the trench 25 is lined with the lining layer 32, which in this embodiment of the invention is also a deposited oxide layer, and then the remainder of the trench is filled with the filling material 33 which is also polysilicon deposited by a chemical vapour deposition process.

Figure 6:
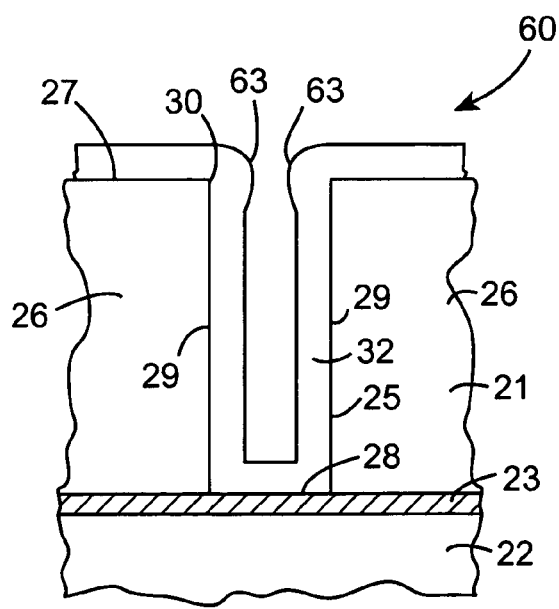
FIG. 6 is a view similar to FIG. 4 of an SOI structure according to a further embodiment of the invention being formed.
Figures 7, 8:
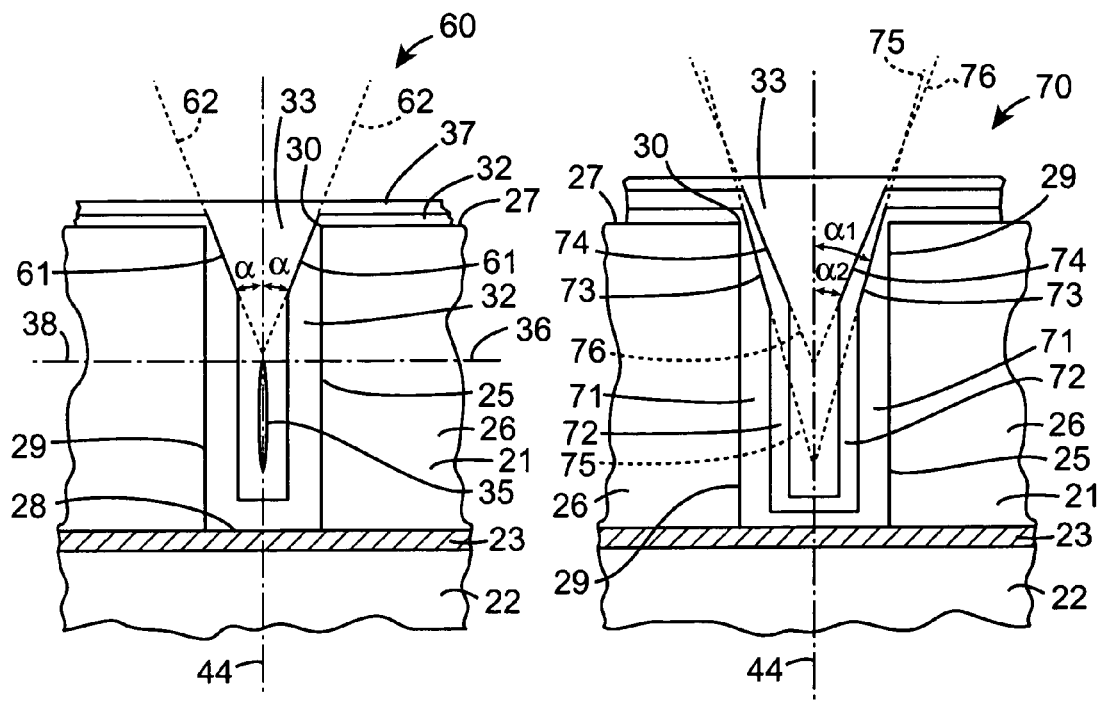
FIG. 7 is a view similar to FIG. 4 of the SOI structure of FIG. 6 also being formed.
FIG. 8 is a view similar to FIG. 4 of an SOI structure according to a still further embodiment of the invention.

Referring now to FIGS. 6 and 7 there is illustrated a portion of another SOI structure according to another embodiment of the invention indicated generally by the reference numeral 60. The SOI structure 60 is substantially similar to the SOI structure 20, and similar components are identified by the same reference numerals, The main difference between the SOI structure 60 and the SOI structure 20 is that in the method for preparing the filled trenches 25, instead of relieving the trenches 25 by relieving the side walls 29, in this embodiment of the invention the trenches 25 are relieved by forming tapered portions 61 in the lining layer 32 adjacent the open mouths 30 of the trenches 25. The tapered portions 61 define tapering planes 62 which in turn define relief angles $\alpha$ with the central plane 44. In this embodiment of the invention the relief angles $\alpha$ are approximately 8°. However, for ease of illustration the relief angles $\alpha$ are exaggerated. Once the tapered portions 61 have been formed in the lining layer 32 adjacent the open mouths 30 on respective opposite sides of the trenches 25, the remainder of the trenches 25 are filled with the filling material 33. In this embodiment of the invention the lining layer 32 is a deposited oxide layer, and the filling material is polysilicon, which is deposited by a chemical vapour deposition process.

As can be seen in FIG. 7 the formation of the tapered portions 61 in the lining layer 32 adjacent the open mouth 30 on respective opposite sides of the trench 25 displace the commencement of bridging of the trench 26 down to the level 36, from which the void 35 extends downwardly.

Referring now to FIG. 6 the SOI structure 60 is illustrated with one of the filled trenches 25 partially formed. The trench 25 is formed with parallel side walls 29 in the silicon layer 21 by etching as will be described below. The lining layer 32 of oxide is deposited, and as can be seen bread-loafing occurs in the lining layer 32 at 63 adjacent the open mouth 30. Once the deposition of the oxide forming the lining layer 32 has been completed, the lining layer 32 is etched to form the tapered portions 61. In etching the tapered portions 61, the lining layer 32 on the first surface 27 of the silicon layer 21 is also etched as can be seen in FIG. 7. Thereafter once the tapered portions 61 have been formed, the remainder of the trench is then filled with the filling material 33.

Referring now to FIG. 8 there is illustrated an SOI structure 70 according to a further embodiment of the invention. The SOI structure 70 is substantially similar to the SOI structure 20, and similar components are identified by the same reference numerals. The main difference between the SOI structure 70 and the SOI structure 20 is in the formation of the filled trench 25. In this embodiment of the invention two lining layers, namely, a first lining layer 71 and a second lining layer 72 of oxide are deposited sequentially for lining the trenches 25. The first and second lining layers 71 and 72 are substantially similar to the lining layer 32 of the SOI structure 20. Additionally, instead of relieving the trenches 25 by relieving the side walls 29, in this embodiment of the invention the trenches 25 are relieved by relieving both the first and second lining layers 71 and 72 adjacent the open mouths 30 by forming respective first and second tapered portions 73 and 74 in the lining layers 71 and 72, respectively, adjacent the open mouths 30 on respective opposite sides of the trenches 25. After the first tapered portions 73 have been formed on the first lining layer 71 the second lining layer 72 is deposited, and the second tapered portions 74 are formed in the second lining layer 72. The remainder of the trenches 25 are then filled with the filling material which in this embodiment of the invention is polysilicon.

The formation of the trenches 25 in the SOI structure 70 is substantially similar to that of the SOI structure 60. The trenches 25 are formed with the parallel side walls 29 in the silicon layer 21. The oxide of the first lining layer 71 is deposited, and the first lining layer 71 is etched to form the first tapered portions 73. Once the first tapered portions 73 are formed, the second lining layer 72 is deposited, and the second tapered portions 74 are then etched in the second lining layer 72. Thereafter filling of the remainder of the trenches 25 with the filling material is similar to that already described.

The first tapered portions 73 of the first lining layer 71 define first tapering planes 75, which in turn define a first relief angle $\alpha_1$ with the corresponding central plane 44, and the second tapered portions 74 of the second lining layer 72 define second tapering planes 76 which define with the corresponding central plane 44 a second relief angle $\alpha_2$. In this embodiment of the invention the first relief angle $\alpha_1$ is approximately 34°, and the second relief angle $\alpha_2$ is approximately 38°. However, for ease of illustration the difference between the angles $\alpha_1$ and $\alpha_2$ is exaggerated in FIG. 8.

As can be seen in this embodiment of the invention no void occurs in the filled trench 25. This is as a result of the fact that no bridging of the trench 25 occurred during filling of the trench with the polysilicon filling material.

Figures 9, 10:
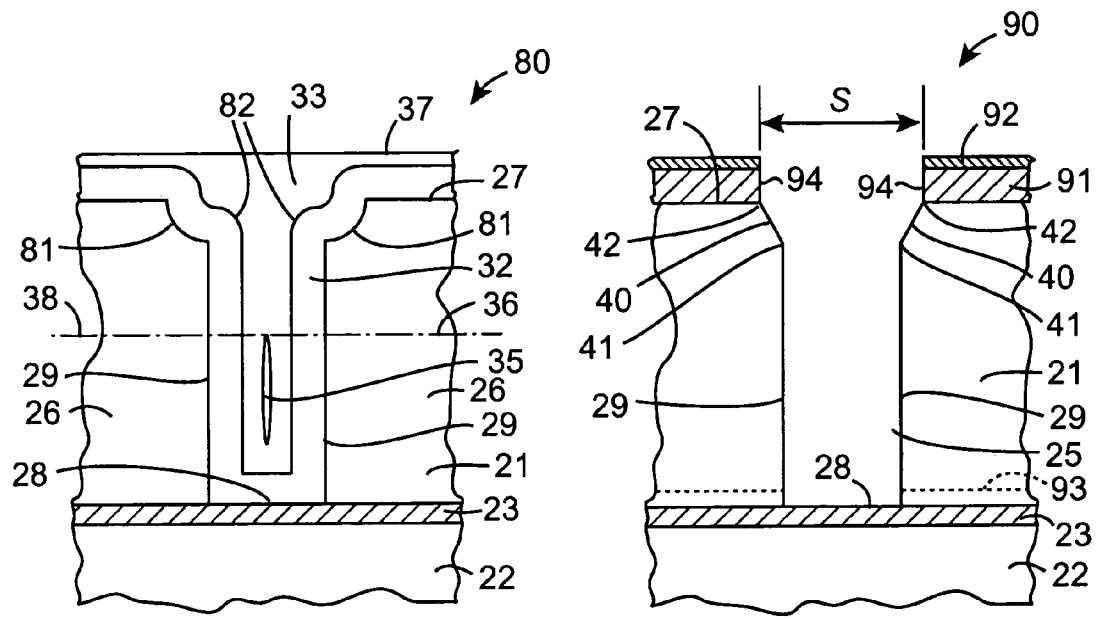
FIG. 9 is a view similar to FIG. 4 of an SOI structure according to a still further embodiment of the invention.
FIG. 10 is a view similar to FIG. 4 of an SOI structure according to the invention, which is substantially similar to the SOI structure of FIGS. 3 and 4 being formed.

Referring now to FIG. 9 a portion of an SOI structure 80 according to a still further embodiment of the invention is illustrated. The SOI structure 80 is substantially similar to the SOI structure 20, and similar components are identified by the same reference numerals. The main difference between the SOI structure 80 and the SOI structure 20 is in the method for forming the filled trenches 25. In this embodiment of the invention the side walls 29 of the trenches 25 are relieved by forming relieving recesses 81 into the silicon layer 21 adjacent the open mouths 30 of the trenches 25 on respective opposite sides thereof which communicate with the trenches 25. The relieving recesses 81 extend longitudinally along the length of the trenches 25, and are formed to be concave in shape when viewed in a direction into the trenches 26.

After relieving the trenches 25 adjacent the open mouths 30 by forming the relieving recesses 81, the lining layer 32 is deposited in the trenches 25 to the desired depth, and thereafter the remainder of the trenches 25 are filled with the filling material 33. In this embodiment of the invention the lining layer 32 is a deposited oxide layer, and the filling material 33 is deposited polysilicon.

If desired, should bread-loafing occur at portions 82 in the lining layer 32 adjacent the transition of the relieving recesses 81 into the trenches 25, the lining layer 32 may be relieved at the portions 82 by tapering the portions 82 in similar fashion as has already been described with reference to the SOI structure 60. The tapering of the portions 82 of the lining layer 32 would be carried out by etching the lining layer 32.

Etching of the silicon layers 21 of the SOI structures 20, 50, 60, 70 and 80 to form the trenches 25 may be carried out by any suitable etching process. Additionally, etching of the lining layers 32 and 71 and 72 may also be carried out by any suitable etching process and will depend on the material of the lining layers. However, in the embodiments of the invention described with reference to FIGS. 3 to 9 the etching of the trenches 25 in the silicon layer 21 is carried out by a suitable reactive ion etch (RIE) using the BOSCH process, and etching of the oxide lining layers is carried out using a dry etch such as an RIE etch using, for example, $CF_4/CHF_3$.

Referring now to FIG. 10 the etching of an SOI structure 90, which is similar to the SOI structure 20 of FIGS. 3 and 4 using an RIE etch will now be described. Components of the SOI structure 90 which are similar to those of the SOI structure 20 are identified by the same reference numerals. After formation of the SOI structure 90, the silicon layer 21 is ground and polished to the desired depth to define the first surface 27. A masking layer 91 of oxide is thermally grown by a thermal oxidation process on the first surface 27. A photoresist layer 92 is applied over the masking layer 91, and the photoresist layer 92 is patterned to define the trenches 25 adjacent their respective open mouths 30. The masking layer 91 is then etched to define the trenches 25, so that the oxide masking layer 91 defines the open mouths 30 to the trenches 25. In other words, the spacing S between opposite edges 94 of the oxide masking layer 91 defining the trenches 25 is similar to the desired width of the trenches 25 adjacent their open mouths 30. The etching of the oxide masking layer 91 is carried out by a suitable wet or dry etch, although a wet etch, in general, is preferred. It is envisaged in many cases that the oxide layer 91 may be omitted, and in which case patterning would be carried out with the photoresist layer 92 only. In such cases, the photoresist layer 92 would be deposited directly onto the first surface 27 and patterned to define the trenches 25 adjacent their open mouths 30.

The SOI structure 90 patterned with either the oxide masking layer 91 or a photoresist layer to define the trenches 25 is then subjected to the RIE etch using the BOSCH process. Initially, the parameters of the RIE etch are ramped to form the tapered portions 40 of the side walls 29 adjacent the open mouth. Once the tapered portions 40 of the trenches 25 have been formed, the parameters of the RIE etch are controlled to continue etching of the trenches 25 from the tapered portions 40 to the buried insulating layer 23, so that the side walls 29 of the etched trenches 25 are substantially parallel to each further. The parameters of the RIE etch for etching the trenches 25 after the tapered portions 40 have been etched may be set so that the side walls 29 of the trenches 25 converge slightly downwardly towards the respective bases 28 of the trenches 26. In order to control the RIE etch using the BOSCH process to etch the tapered portions 40 of the trenches 25 and the trenches 25 themselves, the pressure, the DC bias and the duration of the etch cycle as well as the flow rate of the etchant, which typically is $SF_6$ are varied. A passivation gas may be introduced into the etch cycle to assist in smoothing the side walls 29 and the tapered portions 40 of the trenches 25. Once the trenches 25 have been etched down to the buried insulating layer 23, the masking layer 91 is removed, and the oxide lining layer 32 is deposited. After the lining layer 32 has been deposited, the trenches 25 are filled with the filling material 33 by depositing the filling material, namely, the polysilicon over the lining layer 32, by any suitable chemical vapour deposition process.

Additionally, prior to the formation of the SOI structure, the silicon layer 21 may be ion implanted and/or diffused with a dopant through the surface which when the SOI structure is formed is adjacent the buried oxide layer. Such an ion implanted layer 93 is illustrated in the silicon layer 21 of FIG. 10.

The trenches 25 of the SOI structure 50 of FIG. 5 are etched in similar fashion to the etching of the SOI structure 90, with the exception that additional control of the parameters of the RIE etch is required to produce the first and second tapered portions 52 and 53 of the trenches 25.

Figure 13:
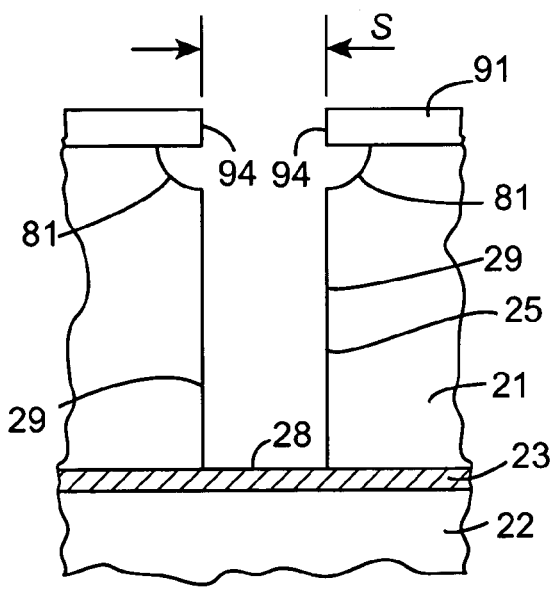
FIG. 13 is a view similar to FIG. 4 of the SOI structure of FIG. 9 being formed.

Referring now to FIG. 13, etching of the trenches 25 in the SOI structure 80 of FIG. 9 is substantially similar to etching of the trenches 25 in the SOI structure 90 of FIG. 10. The oxide masking layer 91 is patterned to define the trenches 25. However, in this embodiment of the invention the spacing S between the opposite edges 94 of the oxide masking layer defining the trenches 25 is similar to the desired width of the trenches 25 below the relieving recesses 81, so that the relieving recesses 81 are etched under the oxide masking layer 91. After the oxide masking layer 91 has been patterned, the portions of the trenches 25 adjacent the open mouths 30 and the relieving recesses 81 are initially etched by an isotropic RIE etch using a gas such as $SF_6$. Thereafter, the parallel side walls 29 of the trenches are etched by an anisotropic RIE etch using the BOSCH process.

Figure 11:
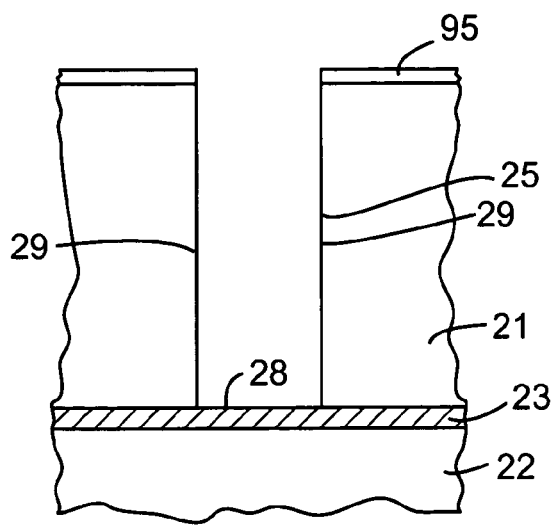
FIG. 11 is a view similar to FIG. 4 of the SOI structure of FIGS. 6 and 7 being formed.
Figure 12:
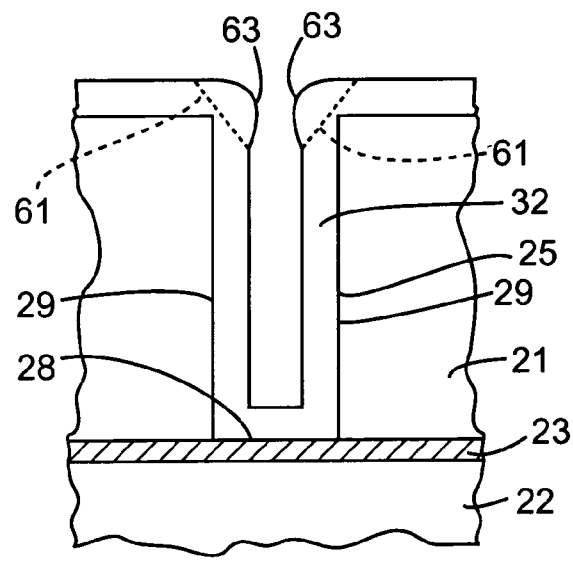
FIG. 12 is a view similar to FIG. 4 of the SOI structure of FIGS. 6 and 7 also being formed.

Referring now to FIGS. 11 and 12 the method according to the invention for forming the filled trenches 25 in the SOI structure 60 will now be described. After the silicon layer 21 has been ground and polished to the desired depth, a photoresist layer 95 is deposited on the first surface 27 of the silicon layer 21, and is patterned to define the trenches 25. The trenches 25 are etched by an RIE etch using the BOSCH process, and the parameters of the RIE etch are controlled to form the trenches 25 with the parallel side walls 29. After formation of the trenches 25 the patterned photoresist layer 95 is removed, and the oxide lining layer 32 is deposited. During deposition of the oxide lining layer 32 bread-loafing of the lining layer 32 occurs at 63 adjacent the open mouth 30 of the trenches 25 The SOI structure 60 is subjected to a dry oxide etch for etching the bread-loafing portions 63 and for etching the lining layer 32 back to form the tapered portions 61. In this case the dry oxide etch is an anisotropic RIE etch using $CF_4/CHF_3$. Thereafter the polysilicon filling material is deposited for filling the trenches 25 by a suitable chemical vapour deposition process.

Forming of the filled trenches 25 in of the SOI structure 70 of FIG. 8 is substantially similar to that of the SOI structure of FIGS. 6 and 7.

When the filling of the trenches 25 has been completed, the filling material, namely, the polysilicon extends from the trenches to a level above the level of the first surface 27. Additionally, in general, the level of the polysilicon extending from the trenches is at a level between the level of the topmost lining layer on the first surface 27, and the first surface 27. In general, the lining layer or layers on the first surface 27 and the polysilicon layer are ground and polished and/or etched back to provide a smooth surface with the polysilicon filling material extending from the trenches co-planar with me surface of the oxide lining layer or layers and exposed through the topmost lining layer. Thereafter, if desired, the oxide lining layer and the portions of the polysilicon filling material extending above the first surface 27 of the silicon layer 21 may be ground, polished and/or etched back to the first surface 27, and indeed, where desired, the silicon layer 21 may be ground down to a desired depth.

When forming the SOI structures 60 and 70, it is desirable that bread-loafing adjacent the open mouths 30 or in any other part of the trenches 25 for example, at the transitions of the second tapered portions of the lining layer 72 to the parallel sided portions thereof should be minimised. The minimising of bread-loafing can be achieved by depositing the oxide lining layers using a high conformality deposition process. Such high conformality deposition processes can be achieved by low pressure chemical vapour deposition processes. In a high conformality low pressure chemical vapour deposition process, the parameters of the chemical vapour deposition process are controlled relatively tightly, this thus permits the ratio of the depth of the oxide lining layer 32 deposited on the side walls of the trenches 25 to the depth of the oxide lining layer 32 deposited on the first surface 27 to be controlled so that the ratio of the respective depths approaches one. In a high conformality low pressure TEOS oxide deposition process, by setting the deposition temperature at 680° C. and the deposition pressure at 700 mTorr a ratio of the respective depths of 0.85 can be obtained. It has been found that a ratio of the respective depths of approximately 0.95 can be achieved by setting the deposition temperature at 650° C. and the deposition pressure at approximately 850 mTorr. A ratio of 0.75 is obtained when the deposition temperature is set at 700° C. and the deposition pressure at 550 mTorr.

Figures 14, 15:
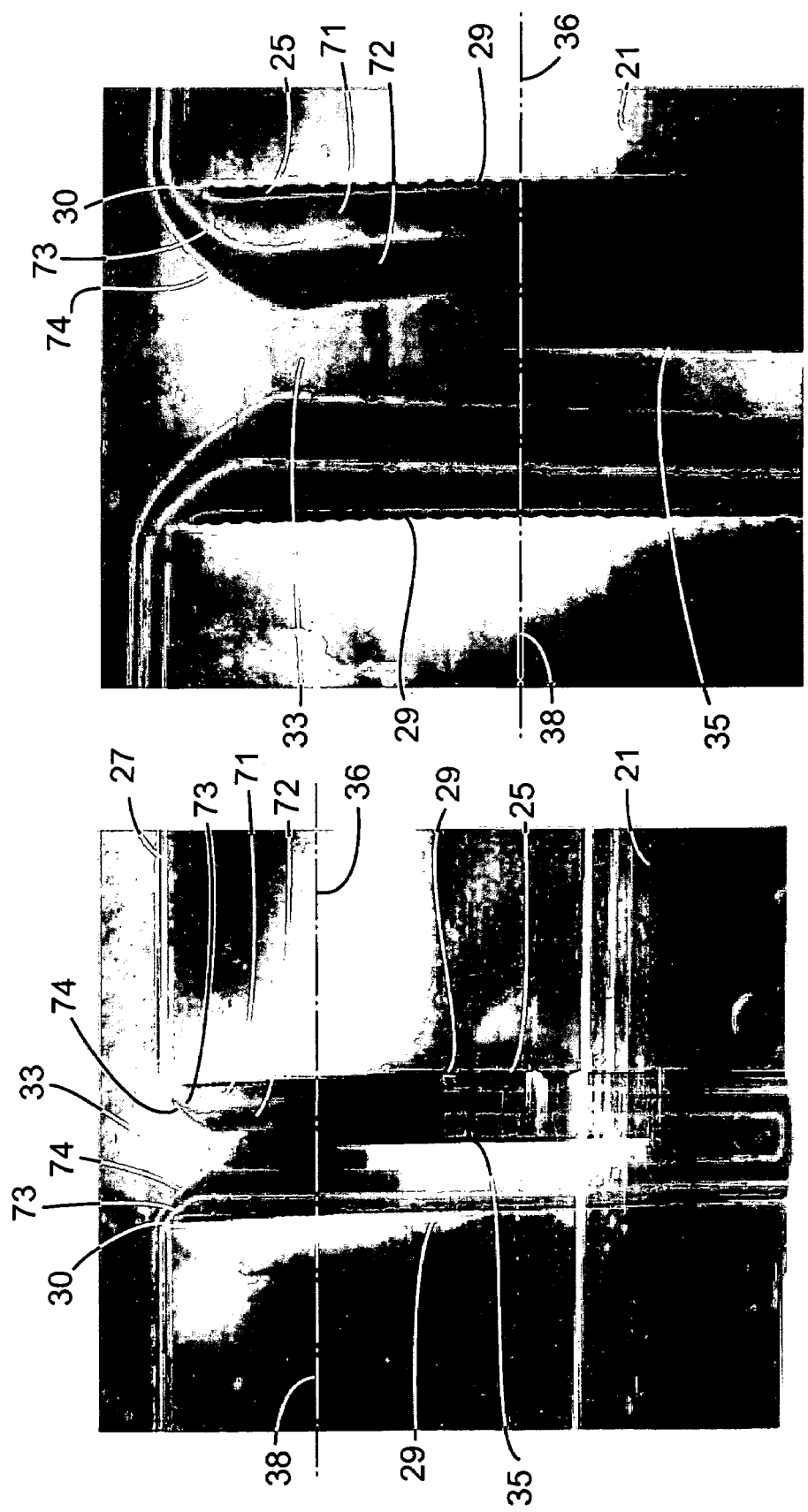
FIGS. 14 to 20 are photomicrographs of semiconductor layers with isolation filled trenches whereby the isolation filled trenches have been formed by methods according to the invention.

Referring now to FIGS. 14 to 18 there is illustrated photomicrographs which illustrate cross-sections of silicon layers of SOI structures illustrating isolation filled trenches formed in the silicon layer by methods according to the invention. In the photomicrographs of FIGS. 14 and 15, which illustrate the same silicon layer 21 with a filled trench 25 at different magnifications, a void 35 is formed in the trench 25 However, as can be seen the void 35 is displaced downwardly into the trench 25 a considerable distance from the open mouth 30 and the first surface 27. The trench 25 of the photomicrographs of FIGS. 14 and 15 is a substantially parallel sided trench, and the portions of the silicon layer 21 defining the trench are not relieved at the open mouth. However, the trench 25 is lined with first and second lining layers 71 and 72 similar to the first and second lining layers 71 and 72 of the SOI structure 70 of FIG. 8. Both the first and second lining layers are relieved by etching first and second tapered portions 73 and 74 into the first and second lining layer 71 and 72 adjacent the open mouth 30 in similar fashion as in the SOI structure 70. Thereafter the trench 25 was filled with the polysilicon as described with reference to the SOI structure 70.

Figure 16:
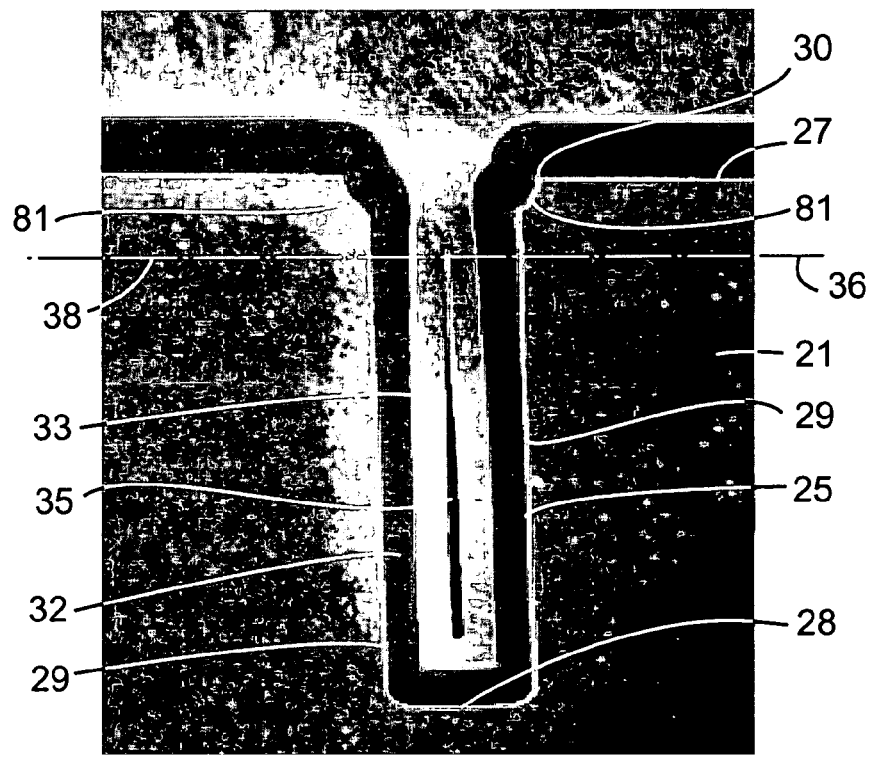

Referring now to FIG. 16 a photomicrograph illustrates a silicon layer 21 with an isolation filled trench 25 formed in the silicon layer 21. In this case the side walls 29 of the trench 25 are relieved by forming relieving recesses 81 adjacent the open mouth 30, similar to the relieving recesses 81 of the SOI structure 80 of FIG. 9. The trench 25 is lined with a lining layer 32, and after the lining layer 32 is deposited, the remainder of the trench 25 is filed with polysilicon. As can be seen a void 35 is formed in the filled trench 25, but has been displaced to the level 36 a significant distance into the trench 25 from the open mouth 30 and the first surface 27.

Figure 17:
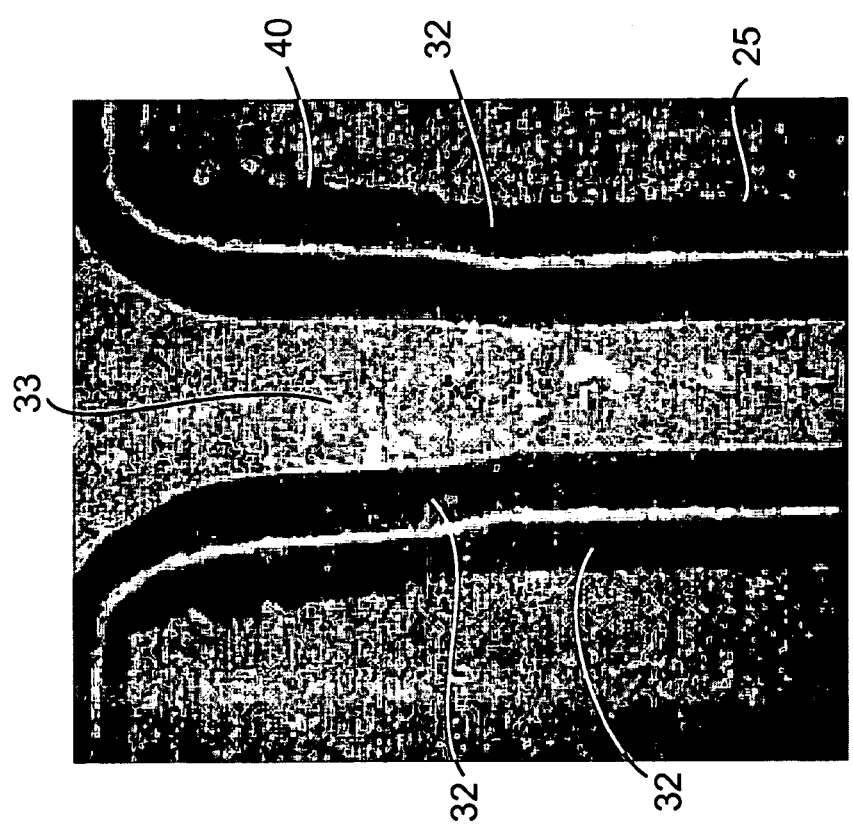
Figure 18:
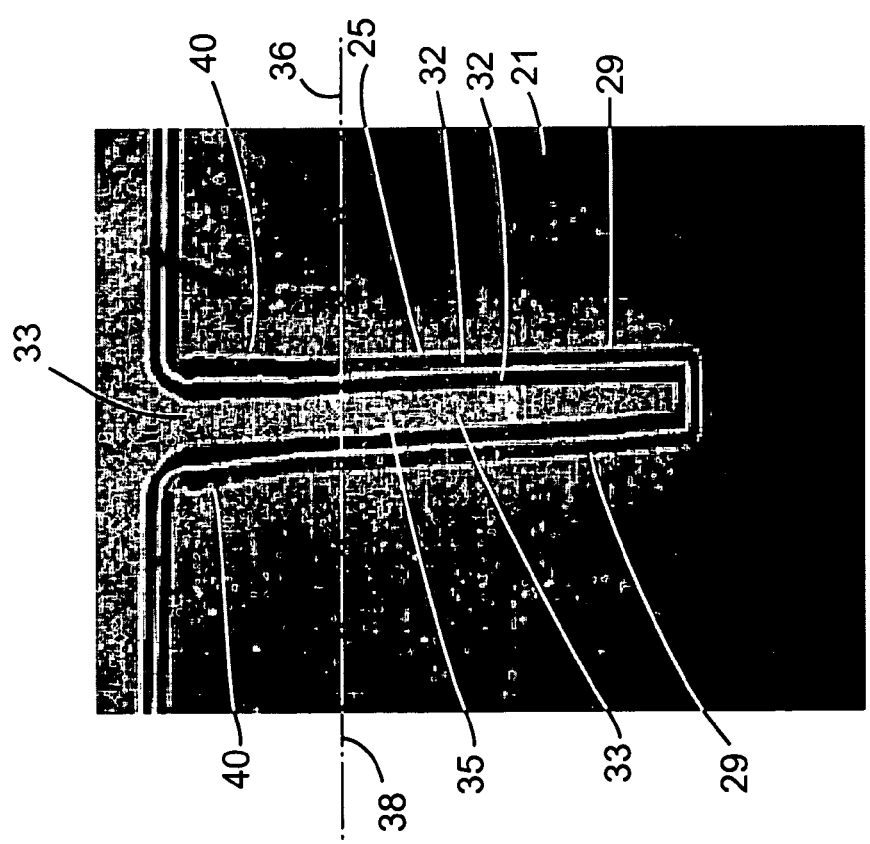

Referring now to FIGS. 17 and 18 photomicrographs of different magnification illustrate a silicon layer 21 with an isolation filled trench 25. Side walls 29 of the trench 25 are relieved adjacent the open mouth 30 by forming tapered portions 40 in the side walls 29 adjacent the open mouth. The tapered portions 40 each define a tapering plane which is somewhat similar to the tapering plane 43 of the SOI structure 20 of FIG. 4, which defines a relief angle of approximately 6° with the central plane 44. As can be seen in the photomicrograph of FIG. 17 only a very small void 35 is formed extending from the level 36 well below the first surface 27.

Figure 20:
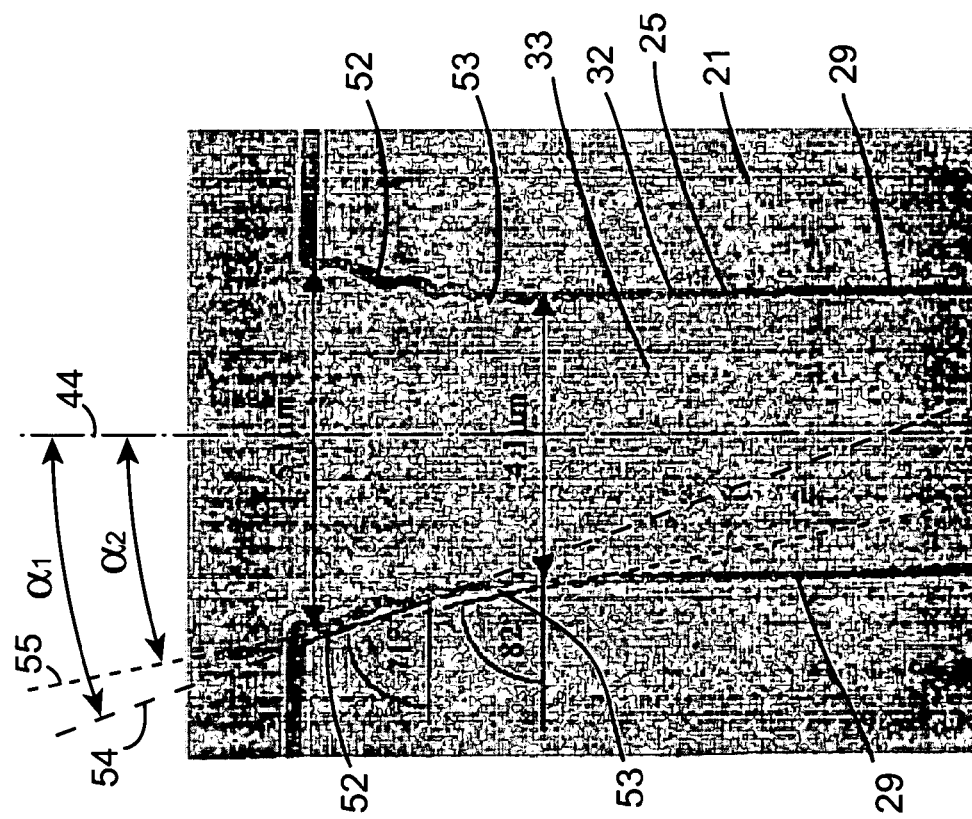
Figure 19:
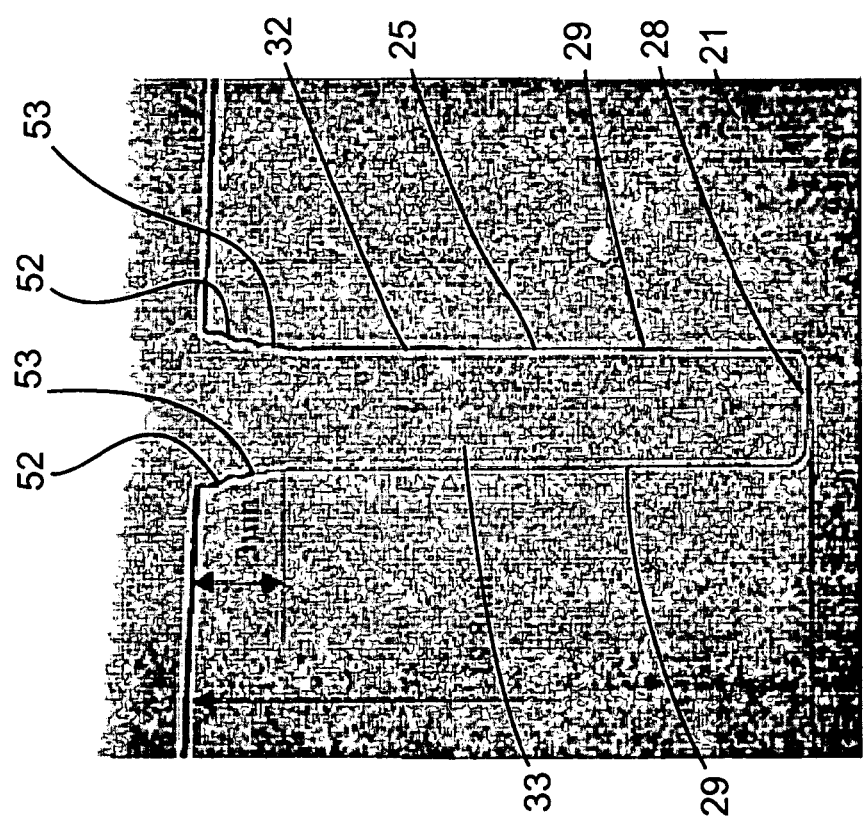

Referring now to FIGS. 19 and 20, photomicrographs at different magnifications illustrate a silicon layer 21 with an isolation filled trench 25 formed therein. The filled is trench 25 is formed by the method described with reference to FIG. 5 where the side walls of the trench 25 adjacent the open mouth are tapered to form first and second tapered portions similar to the first and second tapered portions 52 and 53 of the SOI structure 50. The first tapered portion 52 defines a first tapering plane 54 which makes a first relief angle $\alpha_1$ with the central plane 44 of approximately 19°. The second tapered portion 53 defines a second tapering plane 55 which defines a second relief angle $\alpha_2$ with the central plane 44 of approximately 8°. The first and second tapered portions 52 and 53 extend into the trench 25 from the first surface 27 to a depth of approximately 3 μm. The depth of the trench is 19.8 μm, and its width along its parallel side walls 29 is 4.1 μm. As can be seen from the photomicrographs of FIGS. 19 and 20, in this particular case no voids were formed in the filled trench 25.

The depths to which the trenches or the lining layers are relieved will to some extent depend on the depth of the trenches, and in particular, will depend on the depth to which commencement of bridging in the trenches is to be displaced into the trenches from the open mouths. However, in general, relieving of the trenches or the lining layer or layers in the trenches to a depth of between 0.5 μm and 5 μm in general should be sufficient. Needless to say, the greater the depth to which the trenches or the lining layers are relieved the greater the depth into the trench to which the void will be displaced from the open mouth, and indeed, by increasing the depth by which the trenches or the lining layers are relieved, the formation of voids in the filled trenches may be eliminated altogether.

Indeed, by forming the trenches with the side walls converging into the trenches towards each other, elimination of voids in the filled trenches could also be avoided.

After each lining layer has been deposited, and if it is to be etched, has been etched, the lining layer may be annealed in order to densify the lining layer. Annealing of each lining layer would typically be carried out at an annealing temperature in the range of 950° C. to 1150° C. for a time period in the range of 66 minutes to 180 minutes.

It has been found that by annealing the lining layer where it is of oxide slip defects in the silicon layer extending from the first surface 27 adjacent the open mouths of the trenches are minimised. It has also been found that by thinning the oxide lining layers on the first surface 27 of the silicon layer 21 during forming of the tapered portions of the oxide lining layers adjacent the open mouths thereof by the RIE oxide etch reduces the occurrence of slip defects in the SOI by reducing stresses in the silicon adjacent the open mouths of the trenches.

Where it is desired to provide electrical continuity between the silicon layer 21 and the handle layer 22, the trenches would be formed through the silicon layer and through the buried insulating layer and would be filled with an electrically conductive filling material, for example, doped polysilicon, which would provide electrical continuity between the silicon layer 21 and the handle layer 22.

Additionally, prior to forming the SOI structure, the silicon layer 21 may be ion implanted and/or diffused with a dopant from the surface which subsequently abuts the buried insulating layer, for in turn forming a buried implanted or doped layer.

Such a doped or implanted layer is illustrated in the silicon layer 21 of FIG. 10, Additionally, on formation of the trenches, prior to lining the trenches, the side walls of the trench defined by the silicon may be ion implanted and/or diffused with a suitable dopant for altering the electrical characteristics of the silicon layer adjacent the filled trenches.

It is also envisaged in certain cases that a covering layer may be provided over the first surface 27 of the silicon layer after the formation of the isolation trenches has been completed, if the filling material and the lining layers have been etched, ground or polished back to the first surface of the silicon layer.

It is also envisaged that in the formation of the trenches undercuts, commonly referred to as footings may be formed into the silicon at the base of the trenches, and where such undercuts are formed, they should preferably be maintained to extend not more than 0.5 μm under the silicon layer from the side walls of the trenches.

In general, it is desirable that when setting the etch and passivation cycles of the RIE etch to form the parallel portions of the side walls of the trench, the parameters of the etch and passivation cycles should be set such that the scallops resulting from the RIE etch extending into the side walls should not extend into the side walls more than 50 nm.

While the lining layers have been described as being of oxide material, the lining layers may be of any other suitable material. For example, in certain cases, it is envisaged that the lining material may be silicon nitride. Additionally, in certain cases, it is envisaged that the trenches may be filled with only one filling material, in other words, the trenches may be filled solely by oxide, or solely by silicon nitride, or solely by polysilicon, or solely by any other suitable filling material. In which case, lining layers of material different to the filling material would not be deposited in the trenches. However, if filled trenches of the construction of those of the SOI structures of FIGS. 6 to 8 were to be filled with only one single filling material, it is envisaged that the filling material would be applied in layers, and in the case of the SOI structure 60 of FIGS. 6 and 7 the first layer of the filling material would be relieved at the open mouths at respective opposite sides of the trenches in similar fashion as the lining layer 32 is relieved. Similarly, in the case of an SOI structure 70 of the type illustrated in FIG. 8, two layers of the filling material would be deposited to form lining layers corresponding to the first and second lining layers 71 and 72, and both layers would be relieved in similar fashion as the first and second lining layers 71 and 72 were relieved in the SOI structure 70 of FIG. 8. However, in certain cases, only one of the first and second lining layers may be relieved. Thereafter filling of the remainder of the trenches 25 would be as already described.

Additionally, while the filling material has been described as being polysilicon, the filling material itself may be an oxide, silicon nitride or any other suitable filling material.

While the side walls of the trenches in some SOI's and the lining layers in other SOI structures have been described as being relieved in specific manners, for example, by forming tapered portions or relieving recesses, any other suitable methods for relieving the side walls and/or the lining layer or layers adjacent the open mouths of the trenches may be used.

While the filled trenches have been described as comprising one lining layer or two lining layers, it will be appreciated that the trenches during filling may be lined with more than two lining layers before the final filling of the trenches takes place. Were more than two lining layers are provided, some or all of the lining layers may be relieved adjacent the open mouths and while in some cases at least the first lining layer may be relieved, in other cases the first lining layer may not be relieved, and in which case the second and/or subsequent lining layers may be relieved. It is also envisaged that tapered portions may be formed in the silicon layer and subsequently formed lining layers. Needless to say, the respective lining layers may be of different lining materials.

It is also envisaged that more than two tapering portions may be formed in each lining layer adjacent the open mouth, and in general, it is envisaged that the angle made by the tapering planes defined by the tapered portions with the central plane of the respective trenches would decrease inwardly into the trench.

While the SOI structures have been described as comprising a silicon layer and a handle layer both of single crystal silicon, the layers of the SOI structures may be of any other suitable silicon material, or indeed any other suitable semiconductor material.

It will also of course be appreciated that the method for forming the filled trenches in the semiconductor layer may be used for forming trenches in a silicon layer of any other silicon substrate, besides an SOI structure.

The invention claimed is:

1. A method for forming a filled trench in a semiconductor layer of a semiconductor substrate, with the effect of trench voids minimized, the method comprising the steps of:
   forming a trench in the semiconductor layer through a first face thereof, the trench defining an open mouth,
   relieving the trench adjacent the open mouth thereof for preventing the commencement of bridging of the trench with a filling material at a level adjacent the first face of the semiconductor layer as the trench is being subsequently filled, the trench being relieved adjacent the open mouth by shaping at least one side of the trench adjacent the open mouth so that the trench tapers inwardly adjacent the open mouth, the at least one side being shaped by forming at least two tapered portions adjacent the open mouth defining respective tapering planes, each tapered portion transitioning from an adjacent tapered portion, and one of the tapered portions transitioning from the side of the trench at an angle thereto, the tapering planes defined by the respective tapered portions converging towards the other side of the trench in a direction into the trench, and defining respective different relief angles with a central plane bisecting the trench and extending longitudinally along the trench through the open mouth, and
   filling the relieved trench through the open mouth with the filling material.

2. A method as claimed in claim 1 in which the trench is sufficiently relieved for preventing commencement of bridging of the trench with the filling material at a level above a plane extending parallel to and below a plane to which the first face of the semiconductor layer is to be finished.

3. A method as claimed in claim 1 in which the trench is relieved adjacent the open mouth thereof on respective opposite sides of the trench.

4. A method as claimed in claim 1 in which the trench is lined with at least one lining layer formed therein with a lining material prior to filling of the trench.

5. A method as claimed in claim 4 in which the trench is relieved by relieving at least one of the lining layers adjacent the open mouth of the trench.

6. A method as claimed in claim 4 in which the trench is relieved by relieving at least the lining layer first formed in the trench.

7. A method as claimed in claim 4 in which the trench is relieved by relieving at least one of the lining layers formed after the first of the lining layers to be formed.

8. A method as claimed in claim 4 in which the trench is relieved prior to lining of the trench with the at least one lining layer.

9. A method as claimed in claim 4 in which the first face of the semiconductor layer adjacent the trench is lined with the lining material during lining of the trench with at least one of the lining layers.

10. A method as claimed in claim 9 in which the filling material and the lining material above the first face of the semiconductor layer are thinned to a level just above the first face of the semiconductor layer.

11. A method as claimed in claim 9 in which the filling material and the lining material above the first face of the semiconductor layer are removed to a level co-planar with the first face of the semiconductor layer.

12. A method as claimed in claim 4 in which the lining material is selected from any one or more of the following materials: oxide, silicon nitride, and polysilicon.

13. A method as claimed in claim 4 in which at least one of the lining layers is a deposited layer.

14. A method as claimed in claim 13 in which each deposited lining layer is deposited by a TEOS deposition process.

15. A method as claimed in claim 13 in which each deposited lining layer is deposited by a high conformality deposition process.

16. A method as claimed in claim 4 in which at least one of the lining layers is a grown layer.

17. A method as claimed in claim 4 in which at least one of the lining layers is densified prior to filling of the trench with the filling material.

18. A method as claimed in claim 1 in which the trench is relieved to a depth from the open mouth in the range of 0.5 µm to 5 µm.

19. A method as claimed in claim 1 in which the relief angle defined by each tapering plane with the central plane lies in the range of 0.2° to 50°.

20. A method as claimed in claim 19 in which the relief angle defined by each tapering plane with the central plan lies in the range of 4° to 40°.

21. A method as claimed in claim 20 in which the relief angle defined by each tapering plane with the central plane lies in the range of 6° to 20°.

22. A method as claimed in claim 1 in which the relief angle defined by the tapering plane of the tapered portion closest to the open mouth with the central plane is greatest.

23. A method as claimed in claim 22 in which the relief angles defined by the tapering planes of the respective tapered portions with the central plane decreases with distance of the tapered portions from the open mouth.

24. A method as claimed in claim 1 in which each side of the trench which is relieved is relieved by forming a relieving recess into the first face of the semiconductor layer adjacent to and communicating with the trench adjacent the open mouth.

25. A method as claimed in claim 24 in which the relieving recess is concave when viewed in a direction into the trench.

26. A method as claimed in claim 1 in which each side of the trench which is relieved is relieved along the entire length of the trench.

27. A method as claimed in claim 1 in which the trench is relieved by etching.

28. A method as claimed in claim 27 in which the etching of the trench is carried out by an RIE etch.

29. A method as claimed in claim 28 in which the parameters of the RIE etch are controlled for minimizing the depth of scallops formed by the RIE etch.

30. A method as claimed in claim 27 in which the forming of the trench and the relieving of the trench are carried out by the same etching process, and the parameters of the etching process are ramped during the etching process for relieving the trench.

31. A method as claimed in claim 30 in which the parameters of the etching process are controlled for minimizing the formation of footings at the base of the trench.

32. A method as claimed in claim 1 in which the filling material is selected from any one or more of the following materials: polysilicon, silicon nitride, and oxide.

33. A method as claimed in claim 1 in which the filling material is deposited by a chemical vapor deposition process.

34. A method as claimed in claim 1 in which the semiconductor layer is of silicon.

35. A method as claimed in claim 1 in which the semiconductor layer is of single crystal silicon.

36. A method as claimed in claim 1 in which the semiconductor substrate is a semiconductor layer of a semiconductor on insulator structure, and the filled trench extends to the insulating layer.

37. A method as claimed in claim 36 in which the filled trench extends through the insulating layer.

38. A semiconductor substrate comprising a semiconductor layer, and a filled trench formed in the semiconductor layer, the filled trench being formed by the method as claimed in claim 1.

39. A semiconductor substrate comprising:

a semiconductor layer having a first face, and a filled trench extending into the semiconductor layer through the first face thereof, the trench defining an open mouth and having been relieved adjacent the open mouth prior to filling of the trench with a filling material for preventing the commencement of bridging of the trench with the filling material at a level adjacent the first face of the semiconductor layer as the trench is being subsequently filled therewith, the trench having been relieved adjacent the open mouth by shaping at least one side of the trench adjacent the open mouth so that the trench tapers inwardly adjacent the open mouth, the at least one side having been shaped by forming at least two tapered portions adjacent the open mouth defining respective tapering planes, each tapered portion transitioning from an adjacent tapered portion, and one of the tapered portions transitioning from the side of the trench at an angle thereto, the tapering planes defined by the respective tapered portions converging towards the other side of the trench in a direction into the trench, and defining respective different relief angles with a central plane bisecting the trench and extending longitudinally along the trench through the open mouth.

* * * * *

UNITED STATES PATENT AND TRADEMARK OFFICE
CERTIFICATE OF CORRECTION

PATENT NO. : 7,122,416 B2
APPLICATION NO. : 10/699503
DATED : October 17, 2006
INVENTOR(S) : Nevin et al.

It is certified that error appears in the above-identified patent and that said Letters Patent is hereby corrected as shown below:

On Title Page

Item 57
In the abstract at line 9, delete "wells" and replace with --walls--

Column 1, line 23, insert a comma after the word "other"

Column 1, line 39, insert a comma after the word "as"

Column 1, line 44, delete "wells" and replace with --walls--

Column 1, line 52, insert a comma after the word --oxide--

Column 2, line 4, delete the word "wells" and replace with --wall--

Column 2, line 33, delete "mouth 9 into the trench 2." and replace with --mouth 8 into the trench 2.--

Column 4, line 25, delete "in " and replace with --is--

Column 5, line 18, insert a comma after the word "layer"

Column 5, line 49, insert a comma after the word "not"

Column 7, line 30, delete "36" and replace with --35--

Column 7, line 39, insert a comma after "36"

Column 8, line 5, delete the word "is" after the word "lining"

Column 8, line 25, delete "62" and replace with --52--

Column 8, line 33, delete the word "opening" and replace with the word --tapering--

Column 8, line 50, delete "numerals," and replace with --numerals.--

Column 9, line 4, delete "26" and replace with --25--

Column 10, line 17, delete "26" and replace with --25--

Column 10, line 43, delete "etch" and replace with --etch,--

UNITED STATES PATENT AND TRADEMARK OFFICE
CERTIFICATE OF CORRECTION

PATENT NO. : 7,122,416 B2
APPLICATION NO. : 10/699503
DATED : October 17, 2006
INVENTOR(S) : Nevin et al.

It is certified that error appears in the above-identified patent and that said Letters Patent is hereby corrected as shown below:

Column 11, line 14, delete "further" and replace with "other"

Column 11, line 18, delete "26" and replace with --25--

Column 11, line 20, delete "portions 40 of the trenches 25 and the trenches 25 them-" and replace with --portions 40 of the trenches 25, and the trenches 25 them- --

Column 11, line 22, insert a comma after the word "cycle"

Column 12, line 36, insert a comma after "25"

Column 12, line 67, insert a period and a space after "25"

Column 13, line 41, delete "isolation filled trench 25 formed therein. The filled is trench" and replace with --isolation filled trench 25 formed therein. The filled trench--

Column 13, line 66, insert a comma after the word --relieved--

Column 14, line 13, delete "66" and replace with --60--

Column 14, line 15, inset a comma after the word "oxide"

Column 14, line 37, delete "10," and replace with --10.--

Column 15, line 35, delete "Were" and replace with --Where--

Column 15, line 37, insert a comma after the word "mouths"

UNITED STATES PATENT AND TRADEMARK OFFICE
CERTIFICATE OF CORRECTION

PATENT NO.        : 7,122,416 B2
APPLICATION NO.   : 10/699503
DATED             : October 17, 2006
INVENTOR(S)       : Nevin et al.

It is certified that error appears in the above-identified patent and that said Letters Patent is hereby corrected as shown below:

Column 17, line 11, delete the word "plan" and replace with --plane--

Signed and Sealed this

Twenty-seventh Day of November, 2007

JON W. DUDAS
*Director of the United States Patent and Trademark Office*